United States Patent
Hsieh

(10) Patent No.: US 7,333,335 B2
(45) Date of Patent: *Feb. 19, 2008

(54) USING THE WAVE SOLDERING PROCESS TO ATTACH MOTHERBOARD CHIPSET HEAT SINKS

(75) Inventor: George Hsieh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 10/996,332

(22) Filed: Nov. 23, 2004

(65) Prior Publication Data

US 2006/0050484 A1    Mar. 9, 2006

Related U.S. Application Data

(63) Continuation of application No. 09/897,320, filed on Jun. 29, 2001, now Pat. No. 6,822,867.

(51) Int. Cl.
*H05K 7/20* (2006.01)

(52) U.S. Cl. .................. 361/704; 29/890.035; 361/719

(58) Field of Classification Search ........ 361/717–719, 361/704
See application file for complete search history.

(56) References Cited

U.S. PATENT DOCUMENTS

| | | | |
|---|---|---|---|
| 4,602,315 A | 7/1986 | Breese | |
| 4,605,058 A | 8/1986 | Wilens | |
| 4,849,856 A | 7/1989 | Funari et al. | |
| 4,890,196 A | 12/1989 | Hinshaw | |
| 4,945,401 A | 7/1990 | Trunk et al. | |
| 5,311,395 A | 5/1994 | McGaha et al. | |
| 5,375,652 A | 12/1994 | Matsunaga et al. | |
| 5,444,942 A * | 8/1995 | Knudsen | 49/261 |
| 5,566,052 A * | 10/1996 | Hughes | 361/704 |
| 5,875,097 A | 2/1999 | Amaro et al. | |
| 5,901,781 A | 5/1999 | Arai et al. | |
| 5,926,371 A | 7/1999 | Dolbear | |
| 5,986,888 A | 11/1999 | Amaro et al. | |
| 6,068,051 A | 5/2000 | Wendt | |
| 6,180,874 B1 | 1/2001 | Brezina et al. | |
| 6,219,241 B1 | 4/2001 | Jones | |
| 6,392,888 B1 | 5/2002 | Chen et al. | |
| 6,822,867 B2 | 11/2004 | Hsieh | |

FOREIGN PATENT DOCUMENTS

| | | |
|---|---|---|
| JP | 10-189841 | 7/1998 |
| JP | 2000-138483 | 5/2000 |

* cited by examiner

*Primary Examiner*—Gregory D Thompson
(74) *Attorney, Agent, or Firm*—Schwegman, Lunbderg & Woessner, P.A.

(57) ABSTRACT

A electronic device and method for extracting heat from a heat producing component having front and back sides, the front side is disposed across from the back side, and the front side is attached to a substrate including multiple holes. A thermal interface material is disposed over the back side of the heat producing component. A heat sink including multiple pins corresponding to the multiple holes in the substrate is disposed over the thermal interface material such that the pins are disposed through the holes. The thermal interface material melts and wets to form a thermal coupling between the back side and the heat sink when passed over pre-heaters of a wave soldering machine. Further, the pins are soldered to form solder joints between the respective pins and the substrate when passed over a solder wave in the wave soldering machine to lock-in the thermal coupling formed during the preheating of the thermal interface material to provide a low-cost thermal solution.

18 Claims, 7 Drawing Sheets

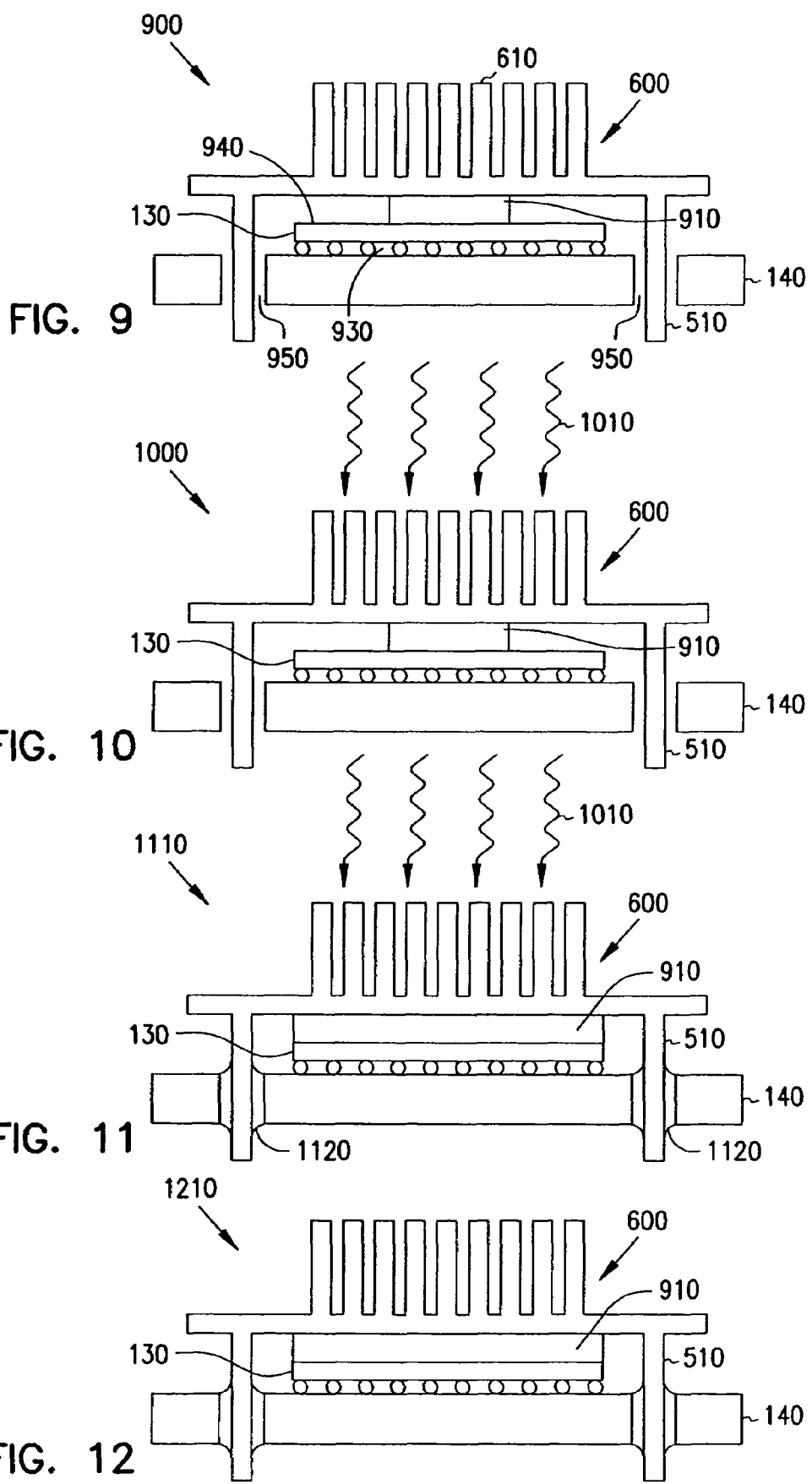

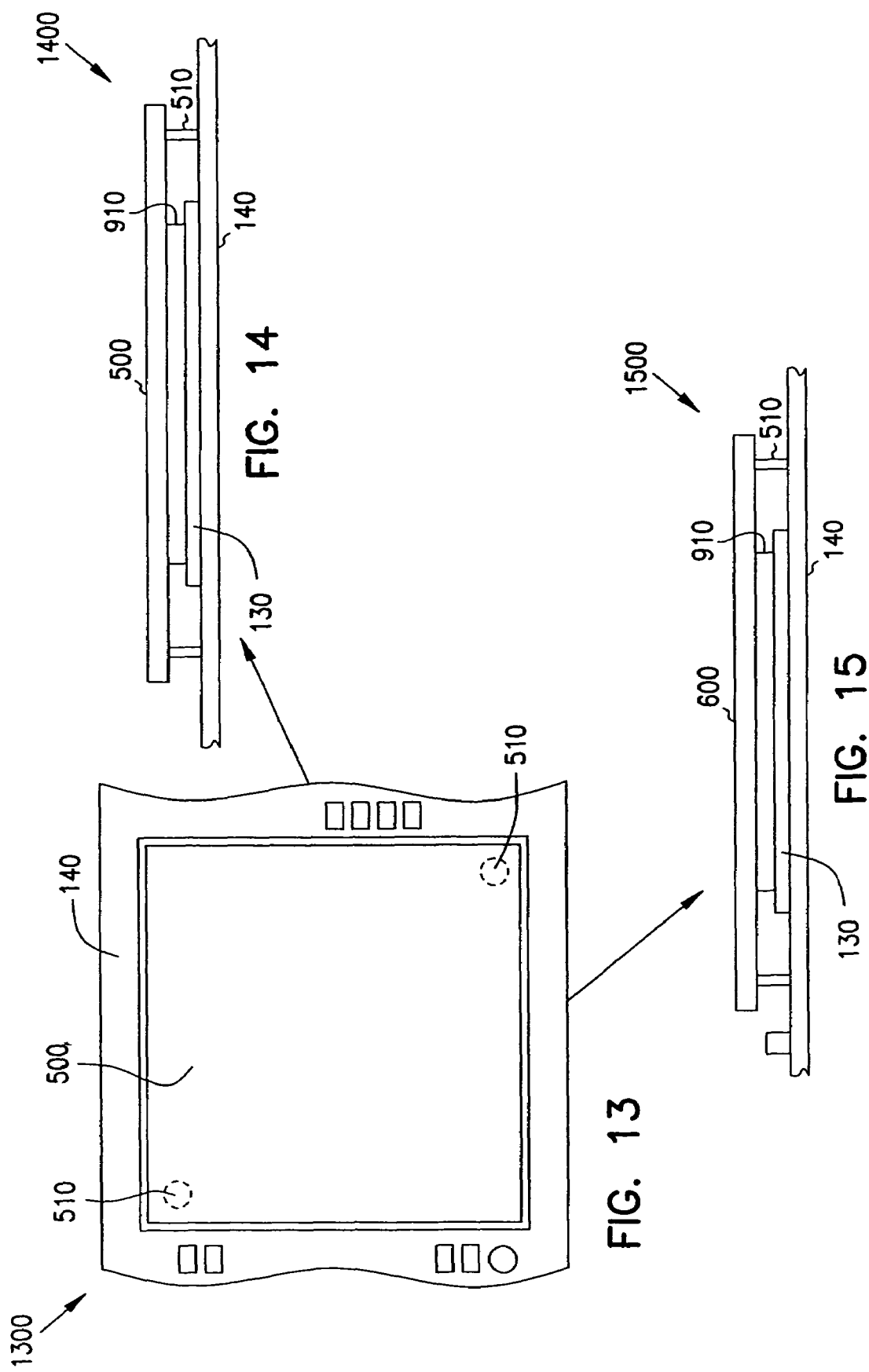

USING THE WAVE SOLDERING PROCESS TO ATTACH MOTHERBOARD CHIPSET HEAT SINKS

This application is a continuation of U.S. patent application Ser. No. 09/897,320 filed on Jun. 29, 2001, now issued as U.S. Pat. No. 6,822,867, which is incorporated herein by reference.

TECHNICAL FIELD

This invention relates generally to printed circuit boards and components coupled therewith, and in particular relates to components that are to be coupled with the printed circuit board.

BACKGROUND

Processors and related computer components are becoming more powerful with increasing capabilities, resulting in increasing amounts of heat dissipated from these components. Similarly, package and die sizes of the components are decreasing or remaining the same, which increases the amount of heat energy given off by the component for a given unit of surface area. Furthermore, as computer-related equipment becomes more powerful, more chips are surface-mounted to the printed circuit board, and more and more components are being placed inside the equipment or chassis which is also decreasing in size, resulting in additional heat generation in a smaller volume of space. Increased temperatures can potentially damage the components of the equipment, or reduce the lifetime of the individual components and equipment. In addition, some components are more susceptible to damage resulting from stress and strain occurring during testing, packaging, and use.

Heat sinks have been used to assist in dissipating heat from the processor and other heat producing components within a housing. However, the overall size of the heat sink is limited by the volume constrains of the housing, and the footprint and/or the size constraints. Heat dissipation has been increased by using fasteners such as mechanical clips, epoxy and/or glue, and/or rivets which physically hold a heat sink to the processor package mounted on a printed circuit board. For some heat sinks, spring-loaded fasteners are used to couple the heat sink with the heat producing components to enhance the heat dissipated from the heat producing components. However, such fasteners require one or more additional final assembly process steps, which results in requiring additional manufacturing resources after all of the soldering steps are completed. These additional manufacturing steps increase the cost of providing a thermal solution to heat producing components such as chipsets.

FIGS. 1, 2, 3, and 4 illustrate conventional manners 100, 200, 300, and 400, respectively, of coupling the heat sink to heat producing components such as chipsets and/or microprocessors. FIG. 1 illustrates using a mechanical clip 110 to couple the heat sink 120 to the heat producing component 130 mounted on a printed circuit board 140 to enhance heat dissipation from the heat producing component 130. FIG. 2 illustrates using epoxy and/or glue 210 to couple the heat sink 120 to the heat producing component 130. FIG. 3 illustrates using spring-loaded fastener 310 to couple the heat sink 120 to the heat producing component 130. FIG. 4 illustrates using rivets 410 to couple the heat sink 120 to the heat producing component 130. All of these prior art techniques require one or more additional final assembly process steps, which increases the cost of providing a thermal solution to heat producing components. In addition, the prior art techniques illustrated in FIGS. 1, 3, and, 4 require substantial circuit board space to mechanically retain the heat sink in-place.

For the reasons stated above, and for other reasons stated below which will become apparent to those skilled in the art upon reading and understanding the present specification, there is a need in the art for a low-cost technique that consumes substantially less circuit board space that the prior art techniques to provide a low-cost thermal solution to the heat producing components.

BRIEF DESCRIPTION OF THE DRAWINGS

FIGS. 9, 10, 11, and 12 illustrate the process steps for assembling an electronic device using the heat sinks shown in FIGS. 5, 6, 7, and 8 according to the teachings of the present invention.

FIGS. 13, 14, and, 15 illustrate the assembled electronic device using the process steps shown in FIGS. 9, 10, 11, and 12.

DETAILED DESCRIPTION

Figure 1:
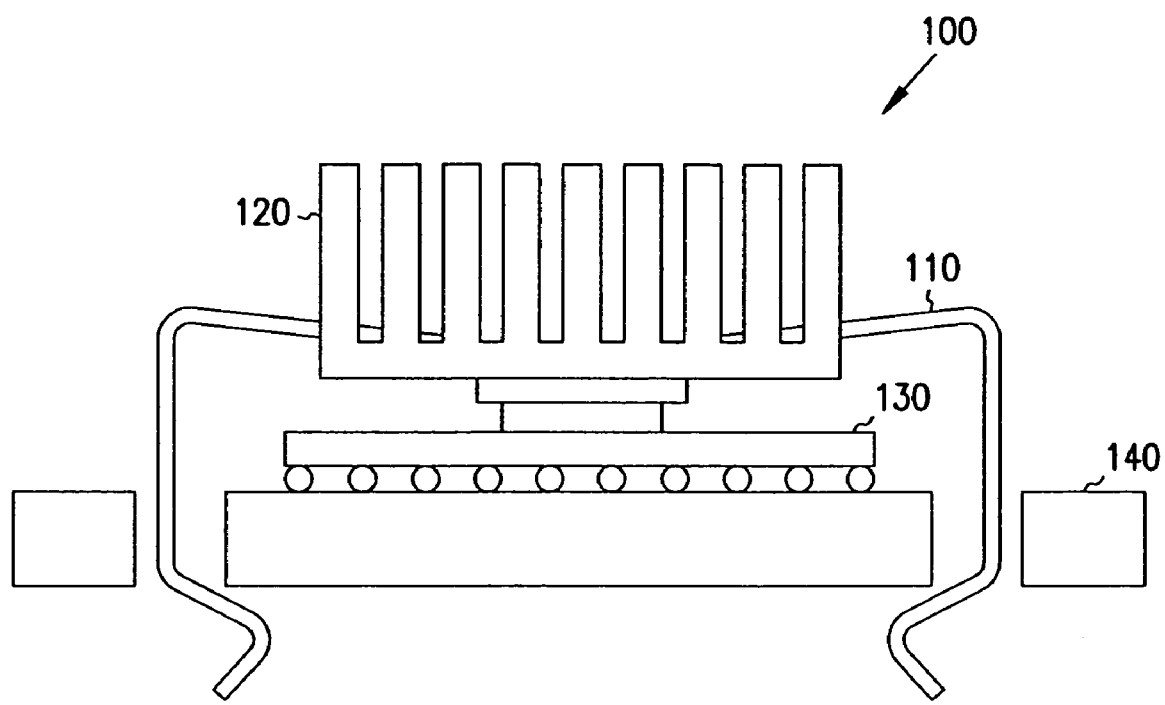
FIGS. 1, 2, 3, and 4 illustrate prior art techniques of coupling heat sinks to heat producing components mounted on a printed circuit board.
Figure 2:
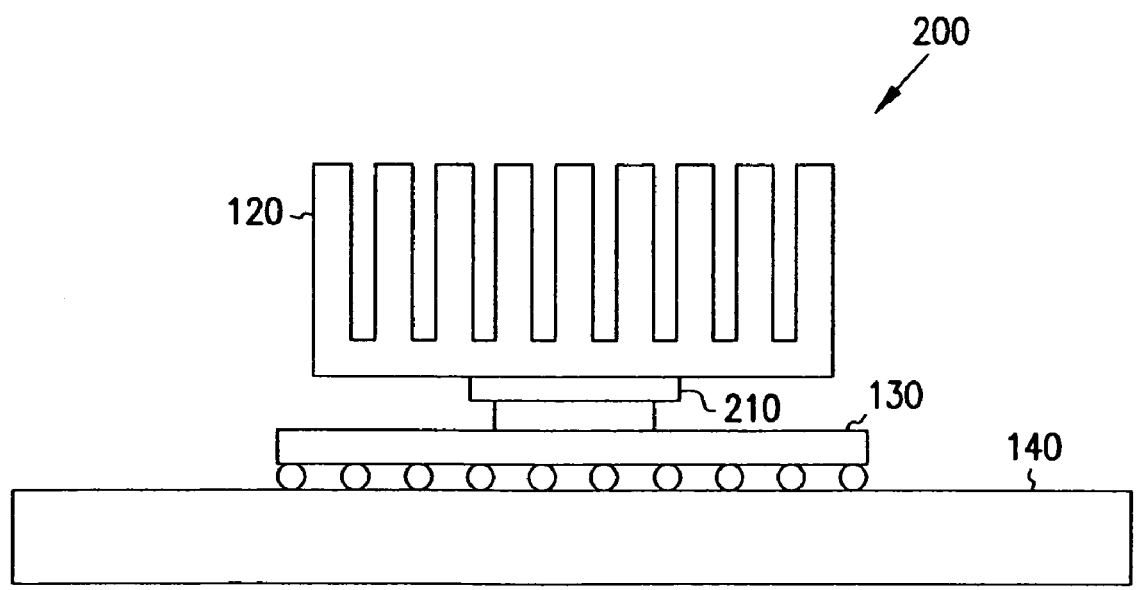
Figure 3:
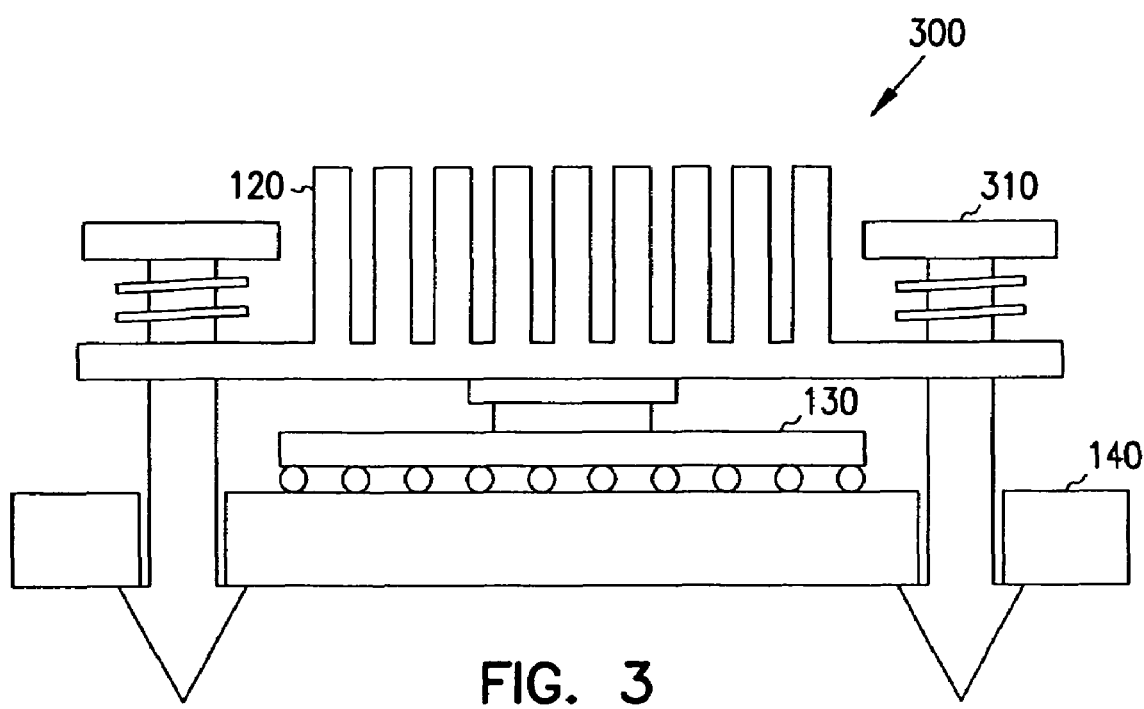
Figure 4:
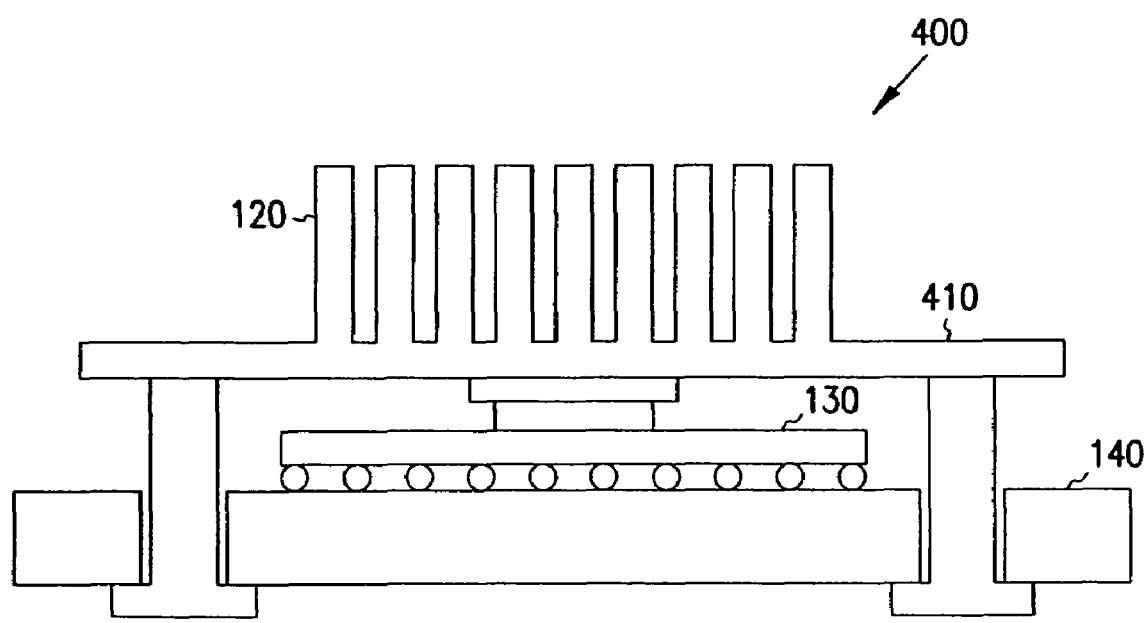

In the following detailed description of the embodiments, reference is made to the accompanying drawings that illustrate the present invention and its practice.

In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included in other embodiments. The following detailed description is, therefore, not to be taken in a limiting sense, and the scope of the present invention is defined only by the appended claims, along with the full scope of equivalents to which such claims are entitled.

This document describes, among other things, a low-cost technique that consumes less circuit board space than the traditional means for providing the chipset thermal solution.

Figure 5:
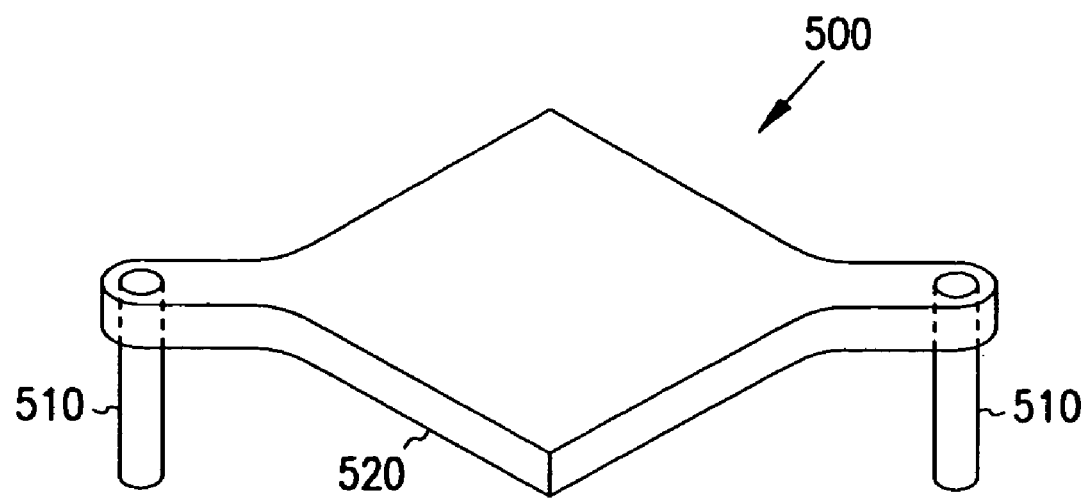
FIGS. 5, 6, 7, and 8 illustrate front elevational views of different example embodiments of the heat sinks according to the present invention.

FIGS. 5, 6, 7, and 8 illustrate front elevational views of different example embodiments of the heat sinks according to the present invention. FIG. 5 illustrates an isometric view of one example embodiment of a heat sink 500 according to the present invention. As shown in FIG. 5, the heat sink 500 includes two mounting pins 510, and a thermally conductive plate 520. In some embodiments, the heat sink 500 can include at least one mounting pin. The pins are adapted to be disposed through corresponding mounting holes in a substrate such that when the heat sink 500 is thermally coupled to a heat producing component, the pins 510 are disposed through the holes for soldering the pins 510 in the holes for mechanically attaching the heat sink 500 to a substrate during pre-assembly operation to provide a low-cost thermal solution. In some embodiments, the heat sink 500 can include multiple pins and corresponding multiple holes in the substrate.

In some embodiments, the pins extend beyond the plate 520 such that the pins 510 can be soldered when the thermally conductive plate 520 is thermally coupled to a heat producing component. The heat sink can be made from materials such as copper, aluminum, and other such materials suitable for dissipating the heat from the heat producing component. In some embodiments, the pins 510 can be soldered to the substrate using processes such as wave soldering, surface mount soldering, and other such soldering processes. In some embodiments, pins can comprise 2 or more wave solderable pins.

Figure 6:
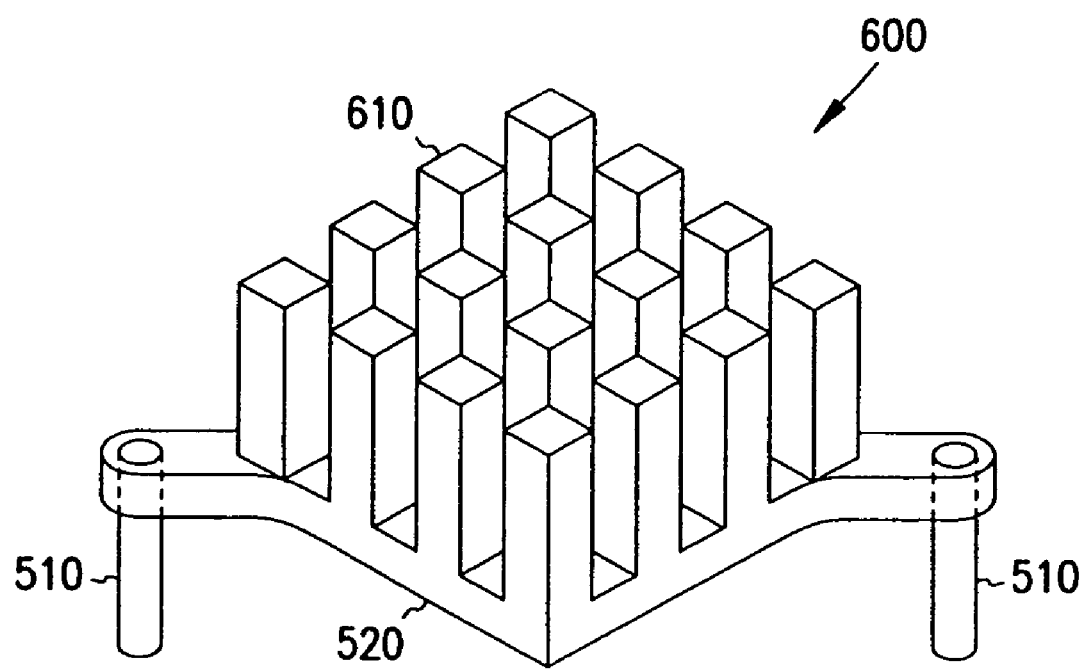

FIG. 6 illustrates an isometric view of another example embodiment of a heat sink 600 according to the present invention. The heat sink 600 shown in FIG. 6 is similar to the heat sink 500 shown in FIG. 5 except that the heat sink 600 shown in FIG. 6 further includes a heat exchange portion 610 disposed across from the pins 510. In some embodiments, the heat exchange portion 610 includes multiple fins that extend upward beyond the plate 520.

Figure 7:
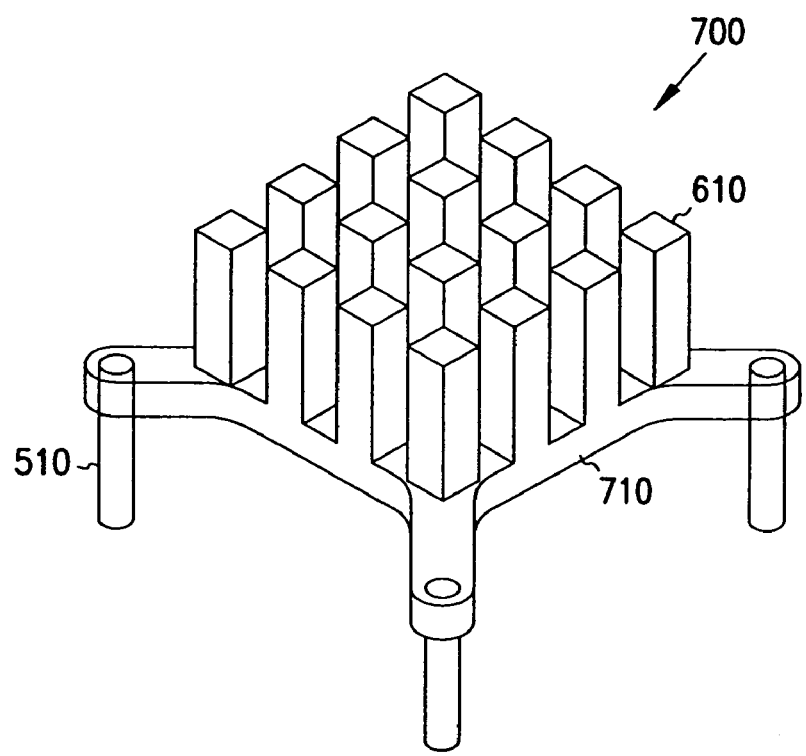
Figure 8:
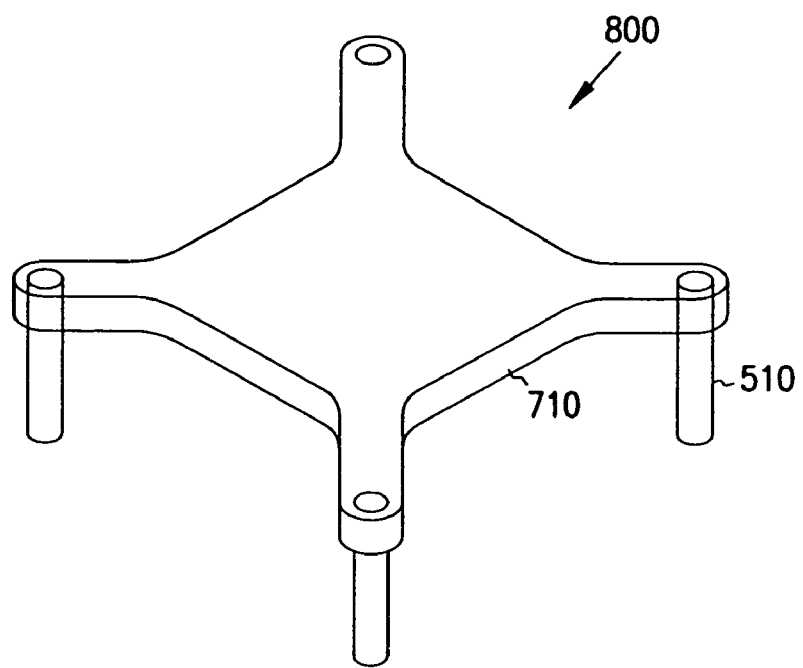

FIGS. 7 and 8 illustrate isometric views of other example embodiments of heat sinks 700 and 800, respectively, according to the present invention. The heat sinks 700 and 800 are similar to the heat sinks 500 and 600 shown respectively in FIGS. 5 and 6, except that the heat sinks 700 and 800 include 4 pins instead of the 2 pins shown in FIGS. 5 and 6. Also, the thermally conductive plate 710 is configured to include the 4 pins shown in FIGS. 7 and 8.

FIGS. 9, 10, 11, and 12 illustrate one example embodiment of methods 900, 1000, 1110, and 1210, respectively required for assembling an electronic device using the heat sinks shown in FIGS. 5, 6, 7, and 8 to at least one heat producing component 130 mounted on a printed circuit board 140 according to the teachings of the present invention.

Method 900 as shown in FIG. 9, begins with mounting a front side 930 of the heat producing component 130 to the substrate 140. The substrate 140 also includes multiple holes 950. In some embodiments, mounting the heat producing component 130 includes electrically and/or mechanically coupling the component 130 to the substrate 140. The heat producing component 130 includes integrated circuit devices such as a chipset, a microprocessor, a digital signal processor, and/or an application-specific integrated circuit device.

Method 900 as shown in FIG. 9 also includes positioning a layer of thermal interface material 910 on to a back side 940 of the heat producing component 130. The back side 940 of the heat producing component 130 is disposed across from the front side 930. In some embodiments, the thermal interface material 910 is either a phase change thermal interface material such as Chomerics T725, Chomerics 705, Chomerics 710, and/or Chomerics 454, or a thermal grease such as Thermalloy TC1, Shinetsu G749, and/or Shinetsu G750. While the thermal greases such as Shinetsu G749, and Shinetsu G750 are in liquid (viscus) form at room temperature, the phase change thermal material such as Chomerics T725, Chomerics 705, Chomerics 710, and Chomerics 454 are in a soft solid paste form at room temperature that melts with heating. These thermal interface materials melt when the active device such as the heat sink it is mounted on is heated at the wave-soldering temperatures. Generally, the phase transition (changing from a paste like state to a liquid state) temperatures of these phase change thermal interface materials are around 55° C.-65° C. Typically the ambient temperatures inside the wave soldering machines (around the pre-heaters and the solder wave chambers) are well above 70° C. Temperatures above 70° C. are generally sufficient to melt the above-mentioned phase change thermal interface materials. Method 900 is compatible with use of either of the above-mentioned thermal interface materials.

Method 900 as shown in FIG. 9 further includes aligning a heat sink 600 including at least one mounting pin 510 over the thermal interface material 910 and further through the corresponding at least one hole 950 in the substrate 140 so that the pins 510 can be wave soldered to the substrate 140. It can also be envisioned that the pins 510 can be designed to be soldered to the substrate 140 using other circuit board assembly techniques such as pin-in-paste, surface mount, and other methods suitable for attaching the heat sink 600 to the heat producing component 130 during pre-assembly operations.

In some embodiments, the heat sink 600 is formed to include a thermally conductive plate such that the pins extend beyond the plate. In some embodiments, the heat sink is formed to further include a heat exchange portion 610 which extends beyond the plate. The heat exchange portion 610 is formed such that the heat exchange portion 610 is disposed across from the heat producing component. In some embodiments, forming the heat exchange portion 610 includes forming multiple fins that extend away from the plate. The heat sink 600 is made from materials such as copper, aluminum, and other such materials suitable for dissipating heat away from the heat source.

Method 1000 as shown in FIG. 10, includes reducing the viscosity of the thermal interface material 910 by preheating 1010 the thermal interface material 910 in a wave soldering preheater to cause the thermal interface material 910 to wet the component to thermally couple the heat sink 600 to the heat producing component 130. In some embodiments, the reducing the viscosity of the thermal interface material 910 further includes loading the substrate including the heat producing component, thermal interface material, and the heat sink on to a conveyor of a wave soldering machine and reducing the viscosity of the thermal interface material by preheating 1010 the thermal interface material disposed between the back side 940 of the heat producing component 130 and the heat sink 600 such that the thermal interface material 910 melts and wets sufficiently the back side 940 and the heat sink 600 to provide sufficient thermal coupling between the heat producing component 130 and the heat sink 600. In a typical wave soldering machine, the thermal interface material 910 is exposed to temperatures of more than 70° C. for a period of 15 to 25 seconds over the pre-heaters, and further the thermal interface material 910 is exposed to temperatures above 80° C. for a period of 8-12 seconds over the solder wave. This is generally sufficient to melt the thermal interface material 910 and wet the back side 940 and the heat sink 600 to produce the necessary thermal coupling between the heat producing component 130 and the heat sink 600. The above-mentioned exposure times and temperatures can be easily changed/adjusted in a typical wave-soldering machine to suit the requirements of a particular process.

Method 1110 as shown in FIG. 11, includes attaching the heat sink 600 in a fixed position on to the heat producing component 130 and the substrate 140 by soldering the at least one pin 510 to the substrate 140 while the thermal interface material 910 is still hot. In some embodiments, the attaching the heat sink 600 in a fixed position includes placing the heat sink 600 in a fixed position on to the heat producing component 130 and the substrate 140 by soldering the at least one pin 510 to the substrate 140 to form solder joints 1120. Soldering the pins 510 locks in the thermal coupling established by the wetting of the thermal grease 910 during the preheating to provide a low-cost thermal solution to the heat producing component 130. In some embodiments, soldering the pins onto the substrate includes wave soldering the at least one pin 510 to the substrate 140 to mechanically attach the heat sink 600 to the substrate 140.

Method 1210 as shown in FIG. 12, includes cooling the soldered pins to mechanical fix the heat sink 600 in-place to form the solder joints 1120 and to further lock-in the thermal coupling established between the back side 940 of the heat producing component 130 and the heat sink 600 while the thermal interface material 910 is still hot.

FIGS. 13, 14, and, 15 illustrate top view 1300, side elevational view 1400, and front elevational view 1500, respectively, of an electronic device including assembled substrate 140 including the heat sink 500 thermally bonded to the heat producing component 130 using the process described with reference to FIGS. 9, 10, 11, and 12. The process of coupling the heat sink 500 to the heat producing component 130 according the present invention is described in more detail with reference to FIGS. 9, 10, 11, and 12. It can be envisioned that more than one heat producing component can be sandwiched between the substrate 140 and the heat sink 500 and further the heat sink can be thermally bonded to more than one heat producing component using the process described with reference to FIGS. 9, 10, 11, and 12. Although not shown in FIGS. 13, 14, and 15, it can be envisioned that an air movement device, such as a fan can be mounted on the heat sink 500 to further enhance heat dissipation from the heat sink 500. In some embodiments, the heat producing component 130 is a integrated circuit device such as a chipset, a microprocessor, a digital signal processor, and/or an application-specific integrated circuit device.

Figure 16:
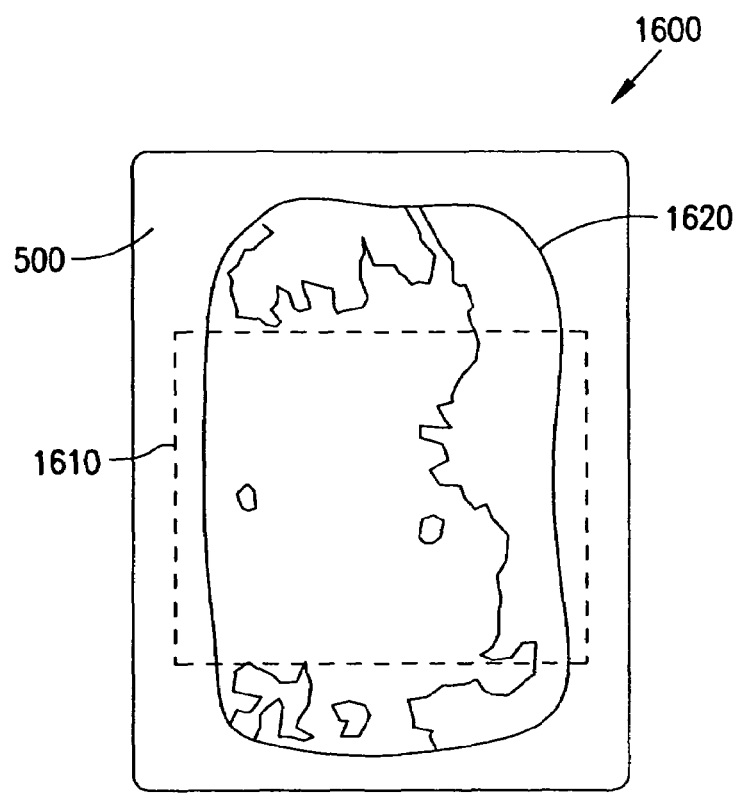
FIGS. 16 and 17 illustrate the coverage/wetting of the thermal interface material between the heat sink and the heat producing component after passing through the wave preheaters.
Figure 17:
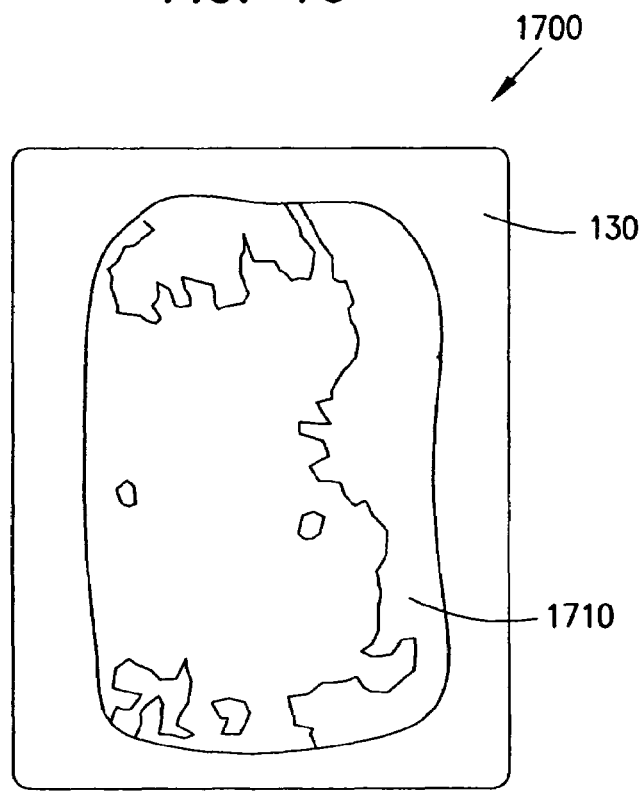

FIGS. 16 and 17 illustrate the coverage/wetting of the thermal interface material on the heat sink side 1600 and the heat producing component side 1700 after passing through the wave pre-heaters. FIG. 16 illustrates the thermal interface material coverage after passing through the wave pre-heaters on the heat sink side 1620. Also shown in FIG. 16 in dotted line is the outline of the original thermal paste 1610 disposed between the heat sink 500 and the heat producing component 130 before passing through the wave pre-heaters. FIG. 17 illustrates the thermal interface material 910 coverage after passing through the wave pre-heaters on the heat producing component 130 side 1710. It can be seen from FIGS. 16 and 17 that the thermal interface material 910 has completely wetted the heat producing component 130 and has spread beyond the outline of the originally disposed thermal paste 1610 after passing through the wave pre-heaters in a typical wave soldering machine.

CONCLUSION

The above-described method and device provides, among other things, a low-cost thermal solution by thermally coupling a heat producing component with a heat sink during the pre-assembly operation.

What is claimed is:

1. A method of assembling an electronic device, comprising:
mounting a heat producing component to a substrate;
positioning a layer of thermal interface material on to the heat producing component such that the thermal interface material is disposed on the substrate;
aligning a heat sink including the at least one mounting pin over the thermal interface material such that the thermal interface material is sandwiched between the heat producing component and the heat sink, and further the at least one mounting pin is disposed though a corresponding hole in the substrate for soldering the at least one mounting pin to the substrate;
reducing the viscosity of the thermal interface material by preheating the thermal interface material in a wave soldering preheater to cause the thermal interface material to wet the component to thermally couple the heat sink to the heat producing component; and
attaching the sink in a fixed position on the heat producing component and the substrate by soldering the at least one mounting pin onto the substrate while the thermal interface material is still hot.

2. The method of 1, wherein the reducing the viscosity of the thermal interface material further comprises:
loading the substrate including the heat producing component, thermal interface material, and the heat sink on to a conveyor of a wave soldering machine; and
preheating the thermal interface material in the preheater of the wave soldering machine to cause the thermal interface material to wet the component.

3. The method of claim 2, further comprising:
cooling the soldered at least one mounting pin to mechanically fix the heat sink in place and to further lock in the thermal coupling established between the heat producing component and the heat sink during the pre-heating.

4. The method of claim 1,
wherein the at least one mounting pin is disposed through the corresponding hole in the substrate for wave soldering the at least one mounting pin to the substrate.

5. The method of claim 4, wherein soldering the at least one mounting pin onto the substrate comprises:
wave soldering the at least one mounting pin to the substrate to mechanically attach the heat sink to the substrate, and to further lock in the thermal coupling established between the heat producing component and the heat sink while the thermal interface material is still hot.

6. The method of claim 4, further comprising:
forming the heat sink including a thermally conductive plate such that the at least one mounting pin extends beyond the thermally conductive plate.

7. The method of claim 6, wherein forming the heat sink further comprises:
forming a heat exchange portion such that the heat exchange portion extends beyond the thermally conductive plate and across from the heat producing component.

8. The method of claim 7, wherein forming the heat exchange portion comprises:
forming multiple fins extending away from the thermally conductive plate.

9. The method of claim 1, wherein the heat sink is made from a material selected from the group consisting of copper, aluminum, and other such materials suitable for dissipating heat away from the heat source.

10. The method of claim 1, wherein the thermal interface material capable of melting at wave soldering pre-heat temperatures is selected from the group consisting of a phase change thermal interface material and a thermal grease.

11. The method of claim 10, wherein mounting the heat producing component to the substrate, comprises:
   electrically and/or mechanically coupling the heat producing component to the substrate.

12. The method of claim 1, wherein the heat producing component is an integrated circuit device selected from the group consisting of a chipset, a microprocessor, a digital signal processor, and an application-specific integrated circuit device.

13. A method of assembling an electronic device, comprising:
   mounting a heat producing component to a substrate having at least one mounting hole therein;
   aligning a heat sink having at least one mounting pin to the substrate wherein each of the at least one mounting pin is inserted into a corresponding mounting hole;
   positioning a thermal interface material between the heat producing component and the heat sink; and
   reducing the viscosity of the thermal interface material and securing the heat sink in a fixed position on the substrate by exposing the device to a wave soldering process to cause the thermal interface material to wet and thermally bond the heat sink and the heat producing component and to further solder the at least one mounting pin to the at least one mounting hole.

14. The method of claim 13, further comprising:
   forming the heat sink including a thermally conductive plate such that the at least one mounting pin extends beyond the thermally conductive plate.

15. The method of claim 14, wherein forming the heat sink further comprises:
   forming a heat exchange portion such that the heat exchange portion extends beyond the thermally conductive plate and across from the heat producing component.

16. The method of claim 15, wherein the heat sink is made from a material selected from the group consisting of copper, aluminum, and other such materials suitable for dissipating heat away from the heat source.

17. The method of claim 13, wherein the thermal interface material capable of melting at wave soldering pre-heat temperatures is selected from the group consisting of a phase change thermal interface material and a thermal grease.

18. The method of claim 13, wherein the heat producing component is an integrated circuit device selected from the group consisting of a chipset, a microprocessor, a digital signal processor, and an application-specific integrated circuit device.

* * * * *

UNITED STATES PATENT AND TRADEMARK OFFICE
CERTIFICATE OF CORRECTION

PATENT NO. : 7,333,335 B2  Page 1 of 1
APPLICATION NO. : 10/996332
DATED : February 19, 2008
INVENTOR(S) : Hsieh It is certified that error appears in the above-identified patent and that said Letters Patent is hereby corrected as shown below:

In column 6, line 9, in Claim 1, delete "though" and insert -- through --, therefor.

Signed and Sealed this

Eighth Day of July, 2008

JON W. DUDAS
*Director of the United States Patent and Trademark Office*